(12) United States Patent
Nakaminami et al.

(10) Patent No.: US 10,159,145 B2
(45) Date of Patent: Dec. 18, 2018

(54) CIRCUIT DEVICE AND DISPLAY APPARATUS

(71) Applicant: Sakai Display Products Corporation, Sakai-shi, Osaka (JP)

(72) Inventors: Hiroaki Nakaminami, Sakai (JP); Hidetoshi Nakagawa, Sakai (JP)

(73) Assignee: Sakai Display Products Corporation, Sakai-shi, Osaka (JP)

(*) Notice: Subject to any disclaimer, the term of this patent is extended or adjusted under 35 U.S.C. 154(b) by 0 days.

(21) Appl. No.: 15/549,297

(22) PCT Filed: Feb. 16, 2015

(86) PCT No.: PCT/JP2015/054137
§ 371 (c)(1),
(2) Date: Aug. 7, 2017

(87) PCT Pub. No.: WO2016/132435
PCT Pub. Date: Aug. 25, 2016

(65) Prior Publication Data
US 2018/0020540 A1    Jan. 18, 2018

(51) Int. Cl.
*H05K 1/02*    (2006.01)
*H05K 1/14*    (2006.01)
(Continued)

(52) U.S. Cl.
CPC ............. *H05K 1/0268* (2013.01); *G09F 9/00* (2013.01); *G09F 9/30* (2013.01); *G09G 3/3648* (2013.01);
(Continued)

(58) Field of Classification Search
CPC ...... H05K 1/0268; H05K 1/14; H05K 1/0296; G02F 1/136259; G02F 1/136286
See application file for complete search history.

(56) References Cited

U.S. PATENT DOCUMENTS 8,345,211 B2 * 1/2013 Ozeki ............... G02F 1/136259
349/149
2003/0179158 A1    9/2003 Sakaki
(Continued)

FOREIGN PATENT DOCUMENTS

| JP | 2008026900 | 7/2008 |
| JP | 4255683 B2 | 4/2009 |

(Continued)

*Primary Examiner* — Nathan Milakovich
(74) *Attorney, Agent, or Firm* — Rudy J. Ng; Bret E. Field; BoziceviC, Field & Francis LLP

(57) ABSTRACT

A circuit device comprises: a circuit board on which a plurality of signal lines transmitting a signal, and spare wirings intersecting the signal lines while being insulated therefrom and transmitting a signal if at least one of the signal lines has a defect are arranged; and a plurality of amplifiers each of which has an input terminal to which the signal is input, an output terminal amplifying the signal input to the input terminal and outputting the amplified signal, and a control terminal to which a signal for controlling a turn on or off of an amplification operation is input. The spare wiring includes an input-side spare wiring connected to the input terminal, and an output-side spare wiring connected to the output terminal.

5 Claims, 12 Drawing Sheets

(51) Int. Cl.
  *G02F 1/1362* (2006.01)
  *G09F 9/00* (2006.01)
  *G09F 9/30* (2006.01)
  *H01L 51/50* (2006.01)
  *G09G 3/36* (2006.01)
  *H05K 1/18* (2006.01)
  *G02F 1/1368* (2006.01)
  *G02F 1/1345* (2006.01)
  *H01L 27/32* (2006.01)

(52) U.S. Cl.
  CPC ......... *G09G 3/3674* (2013.01); *G09G 3/3685* (2013.01); *H01L 51/50* (2013.01); *H05K 1/0296* (2013.01); *H05K 1/14* (2013.01); *H05K 1/18* (2013.01); *G02F 1/1368* (2013.01); *G02F 1/13452* (2013.01); *G02F 1/136259* (2013.01); *G02F 1/136286* (2013.01); *G02F 2001/136263* (2013.01); *H01L 27/3276* (2013.01); *H01L 2251/568* (2013.01)

(56) References Cited

U.S. PATENT DOCUMENTS

| | | | |
|---|---|---|---|
| 2007/0040794 A1* | 2/2007 | Kwak | G02F 1/136259 345/100 |
| 2007/0063951 A1 | 3/2007 | Lin et al. | |
| 2010/0060559 A1 | 3/2010 | Nakagawa | |
| 2014/0028654 A1 | 1/2014 | Saitoh et al. | |

FOREIGN PATENT DOCUMENTS

| | | |
|---|---|---|
| JP | 4567058 B2 | 10/2010 |
| WO | 20080075480 | 6/2008 |
| WO | WO2012137817 A1 | 10/2012 |

* cited by examiner

F I G.1
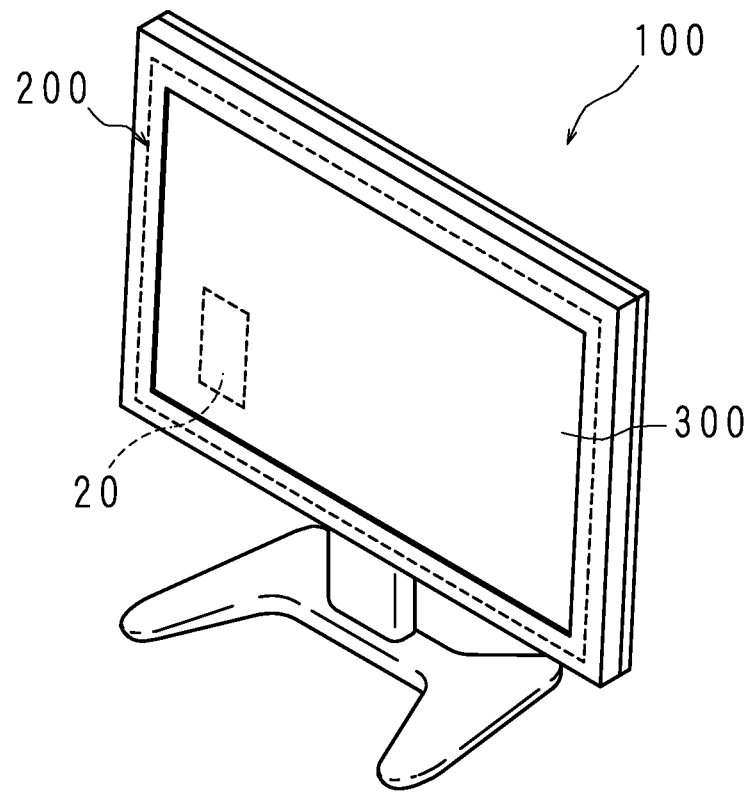

CIRCUIT DEVICE AND DISPLAY APPARATUS

CROSS-REFERENCE TO RELATED APPLICATIONS

This application is the national phase under 35 U.S.C. § 371 of PCT International Application No. PCT/JP2015/054137 which has an International filing date of Feb. 16, 2015, and designated the United States of America.

FIELD

The present disclosure relates to a circuit device including a spare wiring for correcting defects in a signal line, and a display apparatus including the circuit device.

BACKGROUND

A display apparatus such as an active matrix type liquid crystal display apparatus or an organic EL display apparatus includes a thin film transistor (TFT) substrate on which TFTs are formed, and a plurality of source signal lines and a plurality of gate signal lines are arranged in a matrix on the TFT substrate. A drain electrode of each TFT is connected with a pixel electrode, a source electrode is connected with the source signal line, and a gate electrode is connected with the gate signal line. By supplying a gate signal to the gate signal line, the TFT is controlled to be turned on or off. By supplying a source signal to the source electrode of each turned on TFT, a potential of the pixel electrode is controlled to display an image.

In a manufacturing process of such a display apparatus, defects such as disconnection or short circuit may occur in the source signal line or the gate signal line due to contamination with dust at the time of film formation of the TFT substrate or etching using a resist mask in which pinholes are generated. If a defect occurs in the source signal line or the gate signal line, a signal is not correctly transmitted beyond the defective place, such that a display defect occurs on a display screen.

Japanese Patent No. 4255683 and Japanese Patent No. 4567058 disclose a display apparatus in which a disconnected signal line and a spare wiring intersecting the signal line are connected with each other, thereby a signal may be transmitted beyond the disconnected place by bypassing the signal.

Specifically, in the display apparatuses of Japanese Patent No. 4255683 and Japanese Patent No. 4567058, it is possible to correct the above-described display defect by short-circuiting the disconnected signal line and the spare wiring at two places before and after the disconnected place.

SUMMARY

If transmitting the signal using the spare wiring, since a transmission path of the signal is longer than in the normal case, a resistance of the transmission path is increased and the signal is attenuated. In order to solve this problem. Japanese Patent No. 4255683 proposes a configuration that reduces the resistance by widening a width of the spare wiring. Japanese Patent No. 4567058 proposes a configuration in which an amplifier for amplifying the signal is connected to the spare wiring.

However, in order to widen the width of the spare wiring as in Japanese Patent No. 4255683, a wider wiring area is required on the substrate. Since it is necessary for the spare wiring to be arranged in the limited region around the display screen, it is difficult to provide a plurality of spare wirings having a wide width.

In Japanese Patent No. 4567058, the amplifier is connected to only one place of each spare wiring. As in the case of Japanese Patent No. 4255683, since the area on the substrate is limited, the number of the spare wirings to be arranged is limited. Therefore, the place to mount the amplifier is limited.

Since the number of the places to mount the amplifiers is small relative to the number of the signal lines, a distance from the signal line in which the disconnection occurs to the amplifier may be longer. In this case, the resistance of the transmission path of the signal from a short-circuited place between the signal line in which the disconnection occurs and the spare wiring to an input terminal of the amplifier is increased, and the signal input to the amplifier may be attenuated. When the signal input to the amplifier is attenuated, a normal signal is not output from the amplifier, and the display defect caused by the disconnection of the signal line may not be corrected.

In consideration of the above-mentioned circumstances, it is an object to provide a circuit device capable of correcting defects of a signal line without attenuating a signal transmitted to a spare wiring, and a display apparatus including the circuit device.

According to an aspect of the present disclosure, there is provided a circuit device which comprises a circuit board on which a plurality of signal lines transmitting a signal, and spare wirings intersecting the signal lines while being insulated therefrom and transmitting a signal if the signal line has a defect are arranged. The circuit device comprises: a plurality of amplifiers each of which has an input terminal to which the signal is input, an output terminal amplifying the signal input to the input terminal and outputting the amplified signal, and a control terminal to which a signal for controlling a turn on or off of an amplification operation is input, wherein the spare wiring includes an input-side spare wiring connected to the input terminal, and an output-side spare wiring connected to the output terminal.

According to an aspect of the present disclosure, since the amplifier is configured so that the amplification operation is switched between turned on and turned off in accordance with the signal input to the control terminal, only the amplifier of the plurality of amplifiers is selectively operated. In this case, if the other amplifier connected to one output-side spare wiring is turned off, a current does not flow back to the output terminal of the selectively turned-on amplifier, and the amplifier may not be destroyed. Therefore, the amplifier may be connected to a plurality of places of the one output-side spare wiring. If a disconnection occurs in the signal line, among the plurality of amplifiers, the amplifier near an intersection place between the signal line and the spare wiring is selectively turned on, such that a transmission distance of the signal from the intersection place to the input terminal of the amplifier is decreased. Therefore, a resistance of the transmission path is not increased, and the signal is may not be attenuated.

In the circuit device according to another aspect of the present disclosure, the circuit device further comprises control wirings connected to the plurality of control terminals, wherein at least a part of the control wirings is arranged on the circuit board.

According to another aspect of the present disclosure, the amplifier is controlled to be turned on or off by changing the portion of the control wiring arranged on the circuit board. Therefore, a correction of the wiring is performed only on the circuit board.

In the circuit device according to another aspect of the present disclosure, the circuit device further comprises a plurality of input-side spare wirings and a plurality of output-side spare wirings, among the plurality of amplifiers, amplifiers connected to the same input-side spare wiring are connected to the same output-side spare wiring, and each of the input-side spare wirings and the output-side spare wirings is connected with a plurality of the amplifiers.

According to another aspect of the present disclosure, the circuit device includes a plurality of the input-side spare wirings and a plurality of the output-side spare wirings, respectively. The input-side spare wiring and the output-side spare wiring, which are connected through amplifier, cope with the correction of the disconnection in the signal line at one place, such that the disconnection of the signal line at several places may be corrected.

In the circuit device according to another aspect of the present disclosure, the circuit device further comprises a different circuit board electrically connected to the circuit board, wherein the plurality of amplifiers are mounted on the different circuit board.

According to another aspect of the present disclosure, since the amplifier is mounted on the other circuit board connected to the circuit board on which the signal line is arranged, the circuit configuration on the circuit board, on which the signal line is arranged, is simple.

According to another aspect of the present disclosure, there is provided a display apparatus comprising the circuit device as describe above, wherein the signal line transmits an image signal.

According to another aspect of the present disclosure, since the display apparatus includes the circuit device, even when a defect occurs in the signal line, it is possible to prevent an occurrence of a display defect by correcting the wiring.

According to an aspect of the present disclosure, it is possible to correct the defect of the signal line without attenuating the signal flowing through the spare wiring.

The above and further objects and features will more fully be apparent from the following detailed description with accompanying drawings.

BRIEF DESCRIPTION OF THE DRAWINGS

FIG. 1 is a perspective view illustrating a display apparatus according to Embodiment 1.

DETAILED DESCRIPTION

Figure 2:
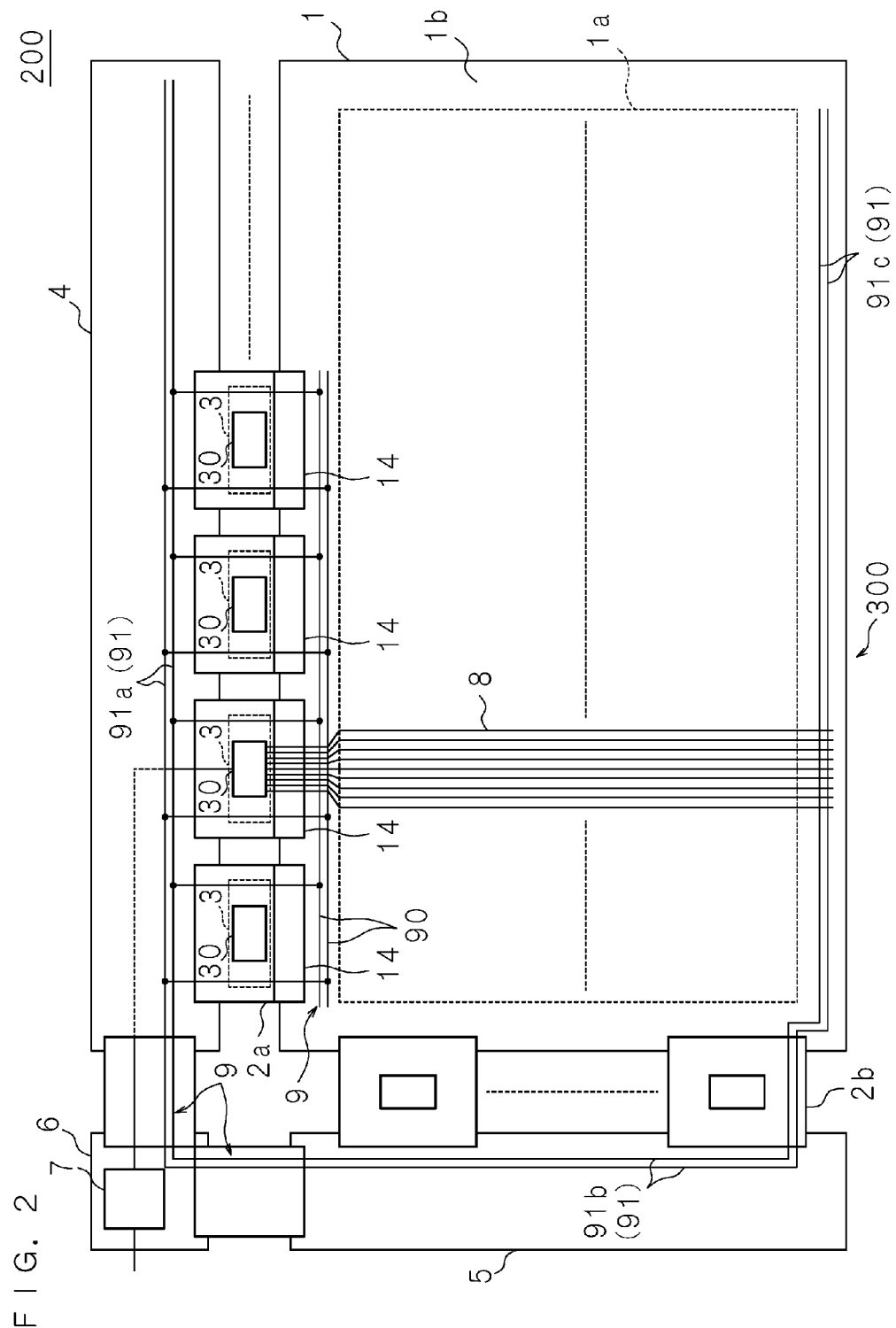
FIG. 2 is a schematic view illustrating a circuit device according to Embodiment 1.

Hereinafter, the present disclosure will be described in detail with reference to the accompanying drawings illustrating embodiments thereof.

Embodiment 1

FIG. 1 is a perspective view illustrating a display apparatus 100 according to Embodiment 1. The display apparatus 100 is, for example, an active matrix type liquid crystal display apparatus. The display apparatus 100 includes a circuit device 200 including a rectangular display panel 300 on which an image is displayed. The display apparatus 100 further includes a television tuner 20 for receiving a television broadcast signal. In the display apparatus 100, for example, the television broadcast signal is received by the television tuner 20, that is, an image signal is processed by the circuit device 200 to display the image on the display panel 300. In addition, the display apparatus 100 may include an image signal input terminal (not illustrated) to display the image based on the image signal input to the image signal input terminal.

The display panel 300 is constituted by facing a rectangular TFT substrate 1 (see FIG. 2) made of glass and a color filter substrate (not illustrated) made of glass having substantially the same shape as the TFT substrate 1, and filling a liquid crystal material into a gap between the TFT substrate 1 and the color filter substrate. The TFT substrate 1 is an example of a circuit board described in the claims.

FIG. 2 is a schematic view illustrating the circuit device 200 according to Embodiment 1. The TFT substrate 1 included in the circuit device 200 has a plurality of source signal lines 8 and a plurality of gate signal lines (not illustrated), which are formed thereon in a matrix shape. The plurality of source signal lines 8 are arranged parallel to a short side of the TFT substrate 1. The plurality of gate signal lines are arranged parallel to a long side of the TFT substrate 1. The source signal line 8 and the gate signal line are orthogonal to each other within a display region 1a. The gate signal line is formed in a lower layer isolated from the source signal line 8 by a gate insulation film made of, for example, silicon oxide (SiOx). The gate signal line and the source signal line 8 respectively transmit a gate signal and a source signal for displaying an image on the display panel 300. The gate signal line and the source signal line are made of metal such as copper or aluminum. The gate signal and the source signal are an example of an image signal described in the claims.

TFTs are formed in the vicinity of each intersection between the source signal line 8 and the gate signal line. A source electrode of each TFT is connected to the source signal line 8, a gate electrode is connected to the gate signal line, and a drain electrode is connected to a pixel electrode. The pixel electrode is formed in each rectangular region partitioned by the gate signal line and the source signal line 8 on the TFT substrate 1 by a transparent conductive film such as indium tin oxide (ITO), and is connected to the drain electrode of each TFT one-to-one. One common electrode facing each pixel electrode is formed on the color filter substrate by the transparent conductive film.

Further, in FIG. 2, for simplification, the gate signal line, the TFT, and the pixel electrode are not illustrated, and only a part of the source signal line 8 is illustrated.

The TFT substrate 1 is connected with a plurality of source-side flexible printed circuit boards 2*a* and gate-side flexible printed circuit boards 2*b*, respectively. A strip-shaped source control board 4 having a control circuit (not illustrated) for controlling the source signal mounted thereon is connected to the TFT substrate 1 while laying a longitudinal direction thereof along one long side of the TFT substrate through the plurality of source-side flexible printed circuit boards 2*a*. Similarly, a strip-shaped gate control board 5 having a control circuit for controlling the gate signal mounted thereon is connected to the TFT substrate 1 while laying the longitudinal direction thereof along one short side of the TFT substrate through the plurality of gate-side flexible printed circuit boards 2*b*.

The source-side and gate-side flexible printed circuit boards 2*a* and 2*b* and the TFT substrate 1 are adhered by an adhesive film such as an anisotropic conductive film, for example. Similarly, the source-side and gate-side flexible printed circuit boards 2*a* and 2*b* and the source and gate control boards 4 and 5 are adhered by an adhesive film such as an anisotropic conductive film. Connection part output terminals 14 are formed at ends of the source-side flexible printed circuit board 2*a* and the gate-side flexible printed circuit board 2*b* on sides thereof adhered to the TFT substrate 1. Wires such as a source signal line 8 and a gate signal line are connected between the source-side and gate-side flexible printed circuit boards 2*a* and 2*b* and the TFT substrate 1 through the connection part output terminal 14.

Each source-side flexible printed circuit board 2*a* has a source driver chip 3 incorporating a source driver 30, which is mounted thereon by, for example, a chip-on-film (COF) method. Similarly, each gate-side flexible printed circuit board 2*b* has a gate driver chip incorporating a gate driver, which is mounted thereon by the COF method. The output terminal of the source driver 30 is connected with the source signal line 8, and the output terminal of the gate driver is connected with the gate signal line, respectively.

The gate driver generates a gate signal according to a gate driver control signal input from the control circuit on the gate control board 5 and supplies the generated gate signal to each gate signal line connected thereto. The source driver 30 generates a source signal according to a source driver control signal input from the control circuit on the source control board 4 and supplies the generated source signal to each source signal line 8 connected thereto.

The source control board 4 and the gate control board 5 are connected to a signal circuit board 6 on which a controller chip 7 is mounted. The controller chip 7 is connected to the television tuner 20 or an external circuit (not illustrated), and an image signal is input from the television tuner 20 or the external circuit. The controller chip 7 generates the source driver control signal and the gate driver control signal according to the image signal input thereto and outputs the generated signals to the control circuits of the source control board 4 and the gate control board 5, respectively.

The circuit device 200 includes the TFT substrate 1, the source-side flexible printed circuit board 2*a*, the gate-side flexible printed circuit board 2*b*, the source control board 4, the gate control board 5, and the signal circuit board 6.

The circuit device 200 includes a plurality of spare wirings 9 for the source signal lines 8. The spare wiring 9 may be arranged so as to transmit the source signal by bypassing the defective portion, when the source signal line 8 has a defect. The spare wiring 9 includes input-side spare wirings 90 and output-side spare wirings 91, which are made of metal such as copper or aluminum, respectively.

The plurality of input-side spare wirings 90 are arranged in a peripheral region 1*b* on an outside of the display region 1*a* on the TFT substrate 1 so as to be laid along the long side of the TFT substrate 1 on a side to which the source control board 4 is connected. Herein, a predetermined number of the input-side spare wirings 90 are arranged from an end to the other end of each constitutional unit including a predetermined number of the source-side flexible printed circuit boards 2*a* for each constitutional unit. The input-side spare wirings 90 between the respective constitutional units are not connected. The input-side spare wirings 90 intersect the plurality of source signal lines 8 through a spare wiring insulation film. In the present embodiment, there are four source-side flexible printed circuit boards 2*a* included in one constitutional unit, and a case, in which the number of the input-side spare wirings 90 arranged for each constitutional unit is two, is exemplified, but the disclosed embodiment is not limited to this example. There may be a modified example in which one source-side flexible printed circuit board 2*a* is one constitutional unit, a modified example in which one half of one source-side flexible printed circuit board 2*a* is one constitutional unit, only one amplifier 12 is connected to each input-side spare wiring 90 and the like.

The output-side spare wiring 91 includes a first relay wiring 91*a* arranged on the source control board 4 from a longitudinal end to the other end thereof, a second relay wiring 91*b* arranged on the gate control board 5 from a longitudinal end to the other end thereof, and an onboard output-side spare wiring 91*c* arranged in the peripheral region 1*b* along the long side on the opposite side of the TFT substrate 1 from an end to the other end thereof, which are connected with each other. The onboard output-side spare wiring 91*c* intersects the plurality of source signal lines 8 through the spare wiring insulation film. The number of the output-side spare wirings 91 is the same as or less than the total number of the input-side spare wirings 90.

Figure 3:
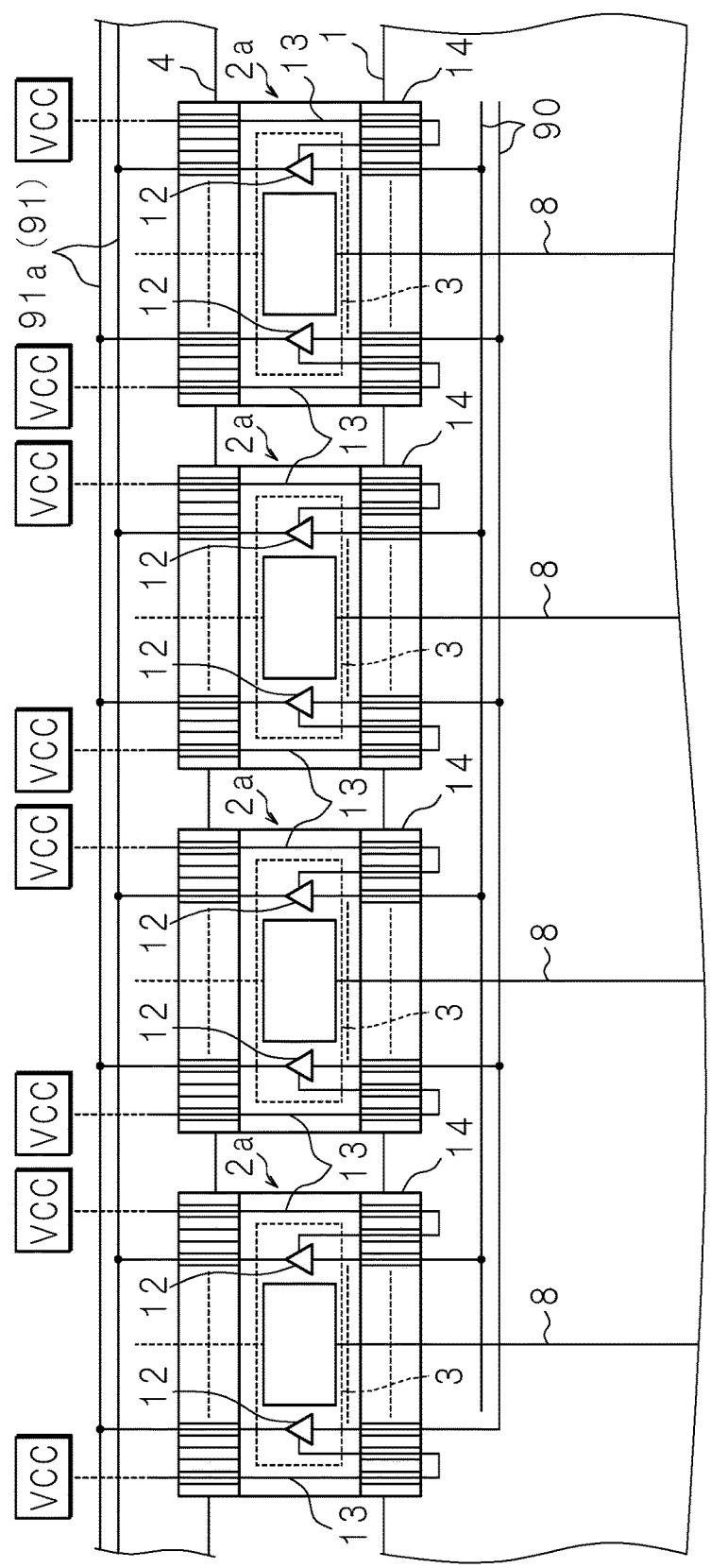
FIG. 3 is a schematic view illustrating a periphery of a source-side flexible printed circuit board of FIG. 2.
Figure 4:
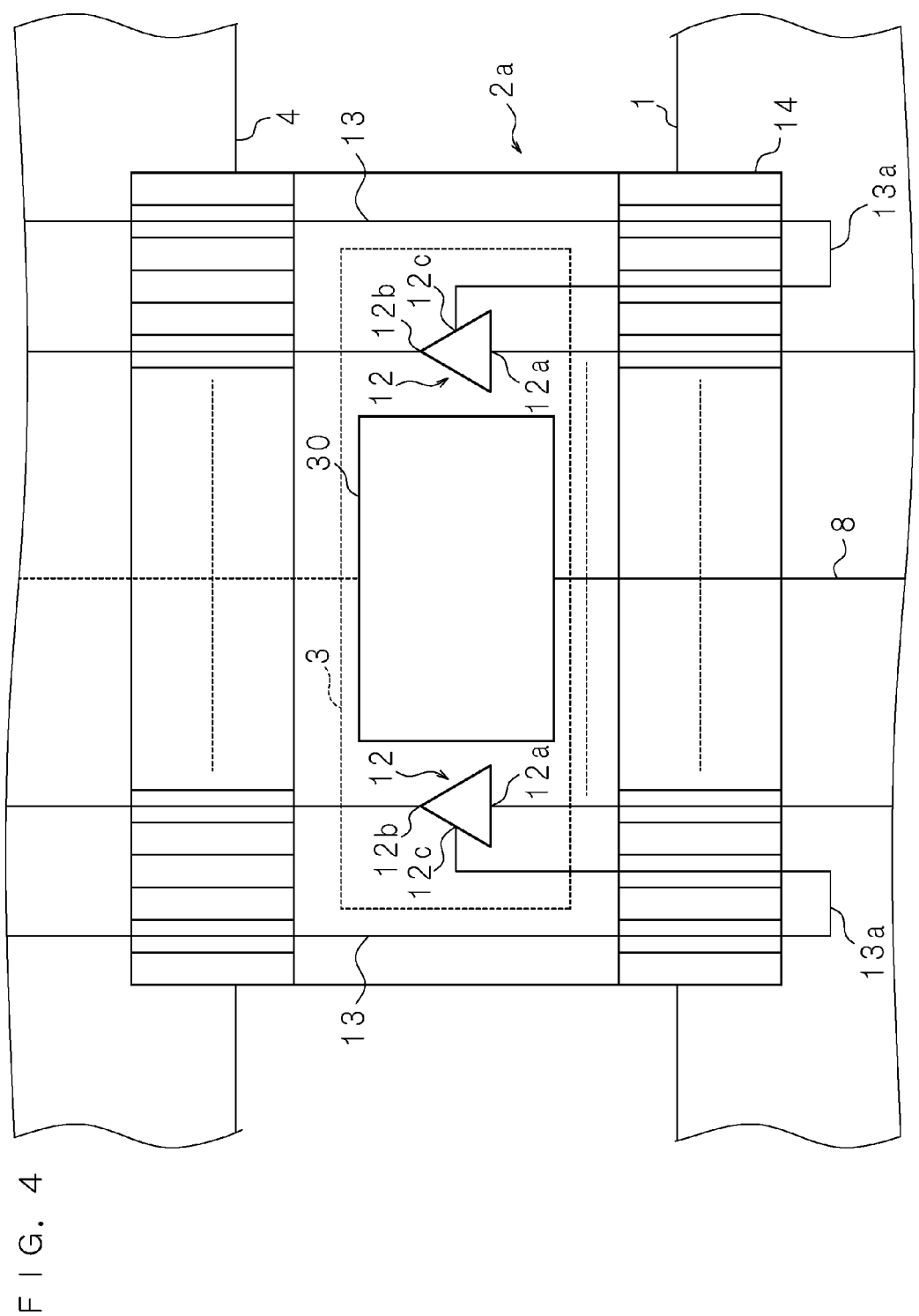
FIG. 4 is an enlarged schematic view of the source-side flexible printed circuit board of FIG. 3.

FIG. 3 is a schematic view illustrating a periphery of the source-side flexible printed circuit board 2*a* of FIG. 2. FIG. 4 is an enlarged schematic view of the source-side flexible printed circuit board 2*a* of FIG. 3. The amplifiers 12 are mounted on the source driver chip 3 on each source-side flexible printed circuit board 2*a* two by two, for example. The amplifier 12 is a buffer amplifier that amplifies and outputs a current of the signal input thereto. The amplifiers 12 have an input terminal 12*a*, an output terminal 12*b*, and a control terminal 12*c*, respectively. For example, the amplifier 12 is configured to be turned off while a signal of voltage Vcc is input to the control terminal 12*c*, and to be turned on when the signal thereof is not input.

The respective one of two amplifiers 12 on each source-side flexible printed circuit board 2*a* included in each constitutional unit is connected to a common input-side spare wiring 90 at each input terminal 12*a*, and is connected to a common first relay wiring 91a at each output terminal 12b. In addition, the respective other of the two amplifiers 12 is connected to the common input-side spare wiring 90 at each input terminal 12a, and is connected to common first relay wiring 91a different from the above at each output terminal 12b. Herein, since each of the first relay wirings 91a is arranged beyond each constitutional unit, it can be connected to the amplifier 12 included in a plurality of constitutional units. Each of the input-side spare wirings 90 is connected to only the amplifier 12 within the same constitutional unit.

The control terminal 12c of the amplifier 12 is connected with one end of an amplifier control wiring 13. The other end of the amplifier control wiring 13 is connected to a constant voltage source for outputting the voltage Vcc on the source control board 4. The amplifier control wirings 13 are arranged so as to once pass through one end of the connection part output terminal 14 of the source-side flexible printed circuit board 2a from the constant voltage source in a direction along a side of the TFT substrate 1, then form folded-back parts 13a by folding back at the peripheral region 1b, again pass through the connection part output terminal 14 from the peripheral region 1b side, and to be connected to the control terminals 12c in the source driver chip 3, respectively. That is, a part of the amplifier control wiring 13 including the folded-back part 13a is arranged on the peripheral region 1b of the TFT substrate 1.

In the circuit device 200 configured as described above, the controller chip 7 generates the gate driver control signal and the source driver control signal according to the image signal input thereto, and supplies the generated gate driver control signal and source driver control signal to the gate driver and the source driver 30, respectively.

The gate driver selects one gate signal line according to the gate driver control signal and supplies the selected gate signal to the gate signal line. Thereby, all the TFTs in one row in the horizontal direction connected to the gate signal line, that is, in the longitudinal direction are turned on.

The source signal is input from the source driver 30 to the source terminal of the TFT which is turned on by the gate signal. A voltage between the pixel electrode and the common electrode is controlled by the source signal input to the source terminal, and an arrangement of liquid crystal molecules between the pixel electrode and the common electrode is controlled. Therefore, light transmittance of each pixel of the display panel 300 is controlled. An image according to the image signal is displayed on the display panel 300 by irradiating the display panel 300 in which the light transmittance is controlled in a pixel unit with light from a backlight.

When manufacturing the TFT substrate 1 of the above-described display panel 300, a circuit may be formed in a state in which defects such as disconnection or short circuit occur in the source signal line 8. Such defects occur due to contamination with dust at the time of film formation of the TFT substrate 1 or use of a resist mask in which pinholes are generated at the time of etching. In the case where a defect occurs in the source signal line 8, since the signal is not correctly supplied to the TFT connected to the defective source signal line 8, the voltage between the pixel electrode and the common electrode is not correctly controlled, and the display defect occurs in the display screen.

In the display apparatus 100 according to the present embodiment, the spare wiring 9 for correcting the defect of the source signal line 8 is arranged. When a defect of the source signal line 8 is detected in an inspection process at the time of manufacturing the display panel 300, the wiring may be corrected by the spare wiring 9 in a wiring correction process to prevent the display defect caused by the defect.

Figure 5:
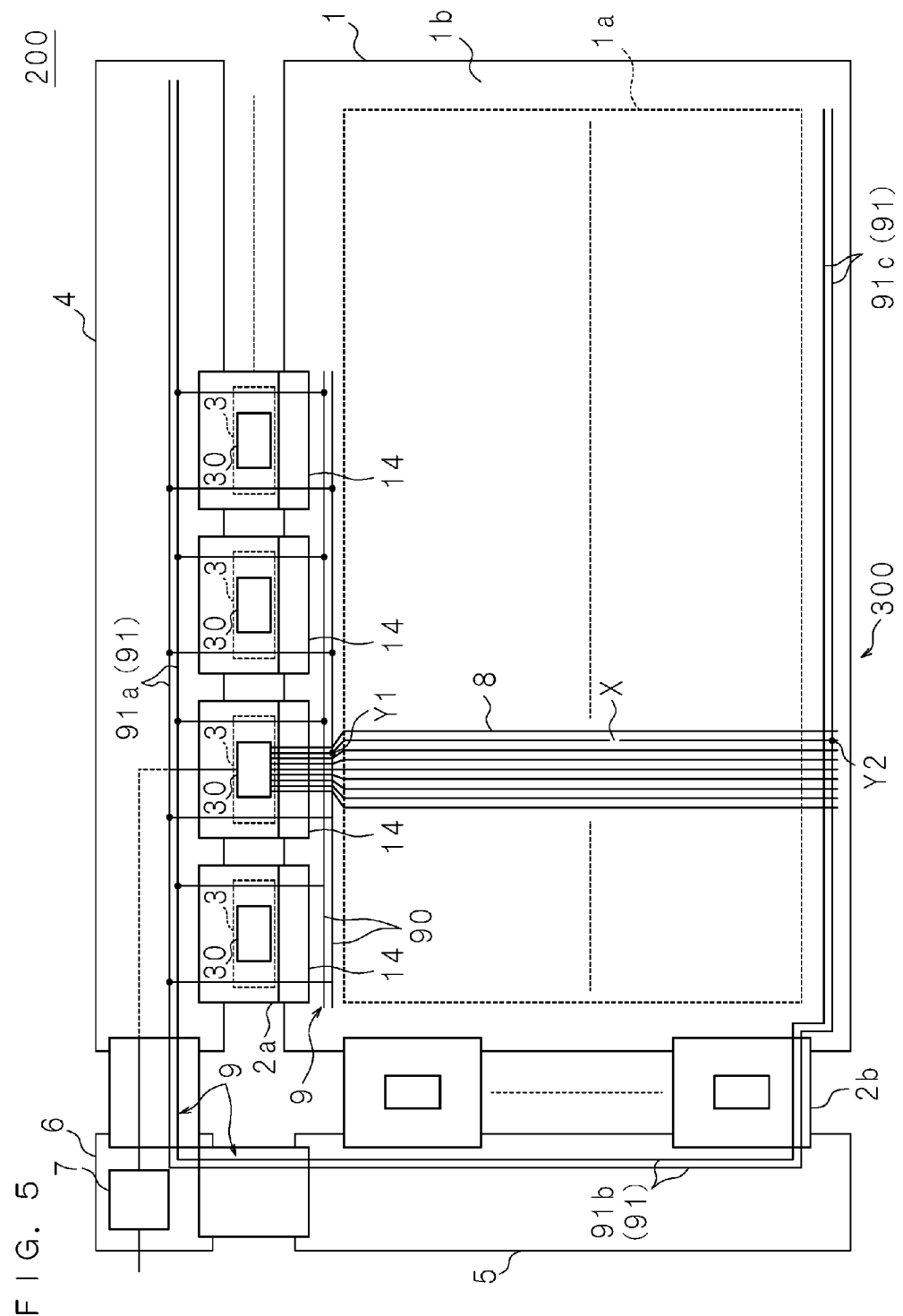
FIG. 5 is a schematic view illustrating a method of correcting a wiring of the circuit device according to Embodiment 1.
Figure 6:
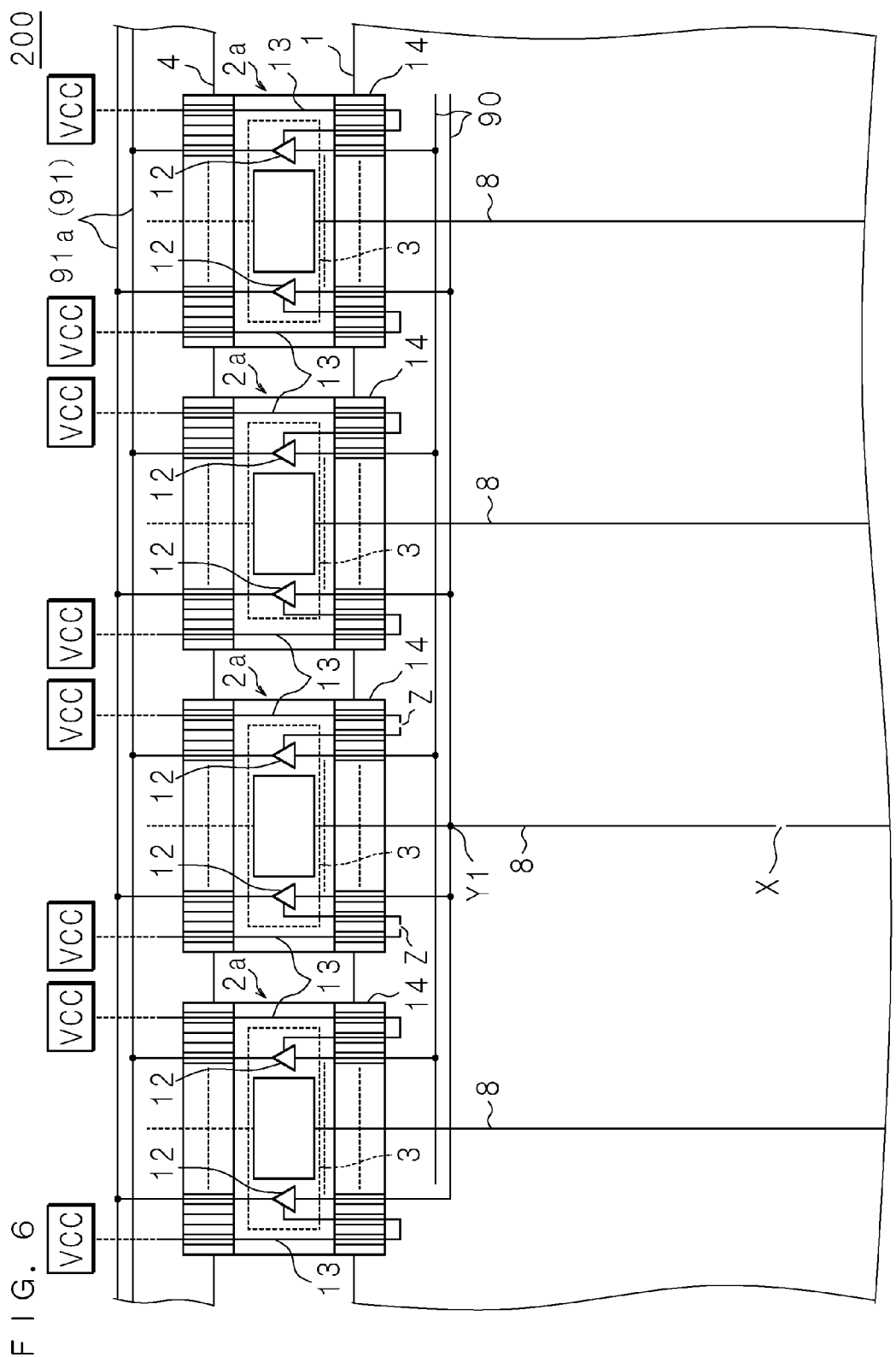
FIG. 6 is a schematic view illustrating the periphery of the source-side flexible printed circuit board of FIG. 5.

FIG. 5 is a schematic view illustrating a method of correcting a wiring of the circuit device 200 according to Embodiment 1. FIG. 6 is a schematic view illustrating the periphery of the source-side flexible printed circuit board 2a of FIG. 5. In FIG. 5, a disconnected place X occurs in one source signal line 8. The source signal from the source driver 30 is not transmitted beyond the disconnected place X of the source signal line 8 (to the lower side in FIG. 5) in which the disconnected place X has occurred.

In order to correct the wiring, the source signal line 8 in which the disconnected place X has occurred, and the input-side spare wiring 90, which intersects a portion before the disconnected place X of the source signal line 8 with the spare wiring insulation film interposed therebetween, are connected at a short-circuited place Y1. Specifically, the spare wiring insulation film at the intersection place is melted by a laser beam, and at the same time the source signal line 8 or the input-side spare wiring 90 at the intersection place is melted, thereby the source signal line 8 and the input-side spare wiring 90 are short-circuited.

In addition, the source signal line 8 in which the disconnected place X has occurred, and the onboard output-side spare wiring 91c, which intersects the portion beyond the disconnected place X of the source signal line 8 and is connected to the same amplifier 12 as the input-side spare wiring 90 connected at the short-circuited place Y1, are connected at the short-circuited place Y2.

Further, among the amplifiers 12 connected to the input-side spare wiring 90 which is short-circuited with the source signal line 8 in which the disconnected place X has occurred, the folded-back part 13a of the amplifier control wiring 13, which is connected to the control terminal 12c of the amplifier 12 provided on the same source-side flexible printed circuit board 2a as the corresponding source signal line 8, is cut off by the laser beam at a cutting place Z in FIG. 4.

By cutting off the folded-back part 13a, the signal of the voltage Vcc is not input to the control terminal 12c, and the amplifier 12 is switched from off to on. By switching the amplifier 12 to on, the source signal input to the input terminal 12a is output from the output terminal 12b, and is transmitted to the source signal line 8 beyond the disconnected place X, which is connected at the short-circuited place Y2 through the output-side spare wiring 91. Since the current of the source signal is amplified by the amplifier 12, the attenuation of the source signal transmitted by the output-side spare wiring 91 which is longer and of a higher load than the source signal line 8 is prevented.

By executing the correction method described above in the wiring correction process, even when the disconnected place X occurs in the source signal line 8 of the TFT substrate 1, it is possible to correct the circuit so that the source signal is correctly transmitted beyond the disconnected place X through the spare wiring 9. Therefore, a manufacturing yield of the TFT substrate 1 may be improved.

In the display apparatus 100 according to the present embodiment, the plurality of amplifiers 12 are connected to one input-side spare wiring 90, and one common output-side spare wiring 91 is connected to the plurality of amplifiers 12. The plurality of amplifiers 12 may be selectively controlled to be turned on or off by cutting off the folded-back part 13a. Therefore, even when only a limited number of the input-side spare wirings 90 and the output-side spare wirings 91 are arranged due to constraints on a wiring area, it is possible to selectively turn on only the amplifier 12 in the vicinity of the short-circuited place Y1 between the source signal line 8 having the disconnection and the input-side spare wiring 90. Therefore, it is possible to shorten a transmission path of the signal from the short-circuited place Y1 to the input terminal 12a. Thereby, the resistance on the transmission path may be reduced. Moreover, it is possible to reduce the intersection place between the transmission path on the input-side spare wiring 90 and the source signal line 8, thereby reducing a capacitive load due to a parasitic capacitance. Accordingly, the attenuation of the source signal input to the amplifier 12 may be reduced, and the signal may be correctly transmitted beyond the disconnected place X of the source signal line 8.

Only the amplifier 12 in the vicinity of the short-circuited place Y1 is selectively turned on among the plurality of amplifiers 12 connected to the one common output-side spare wiring 91, thereby preventing the current from flowing backward from the other amplifier 12 to the output terminal 12b of the turned-on amplifier 12. Therefore, the corresponding amplifier 12 may not be destroyed by the current flowing back to the output terminal 12b. In addition, by outputting different signals from the plurality of amplifiers 12 connected to the one common output-side spare wiring 91, it is possible to prevent noise from entering into the signal transmitted through the output-side spare wiring 91.

Further, since the folded-back part 13a is provided on the peripheral region 1b, the folded-back part 13a may be easily cut off by the laser beam.

Since two input-side spare wirings 90 are arranged for each of four source-side flexible printed circuit boards 2a, it is possible to correct the disconnection occurring in up to two source signal lines 8 for each of four source-side flexible printed circuit boards 2a. In addition, since the input-side spare wiring 90 and the output-side spare wiring 91 are connected one to one through the turned-on amplifier 12 to form the transmission path of the signal, an upper limit for the number of the source signal lines 8 that can be corrected in the whole of the TFT substrate 1 corresponds to the number of the output-side spare wirings 91.

Further, in the display apparatus 100 according to the present embodiment, since the input-side spare wirings 90 are respectively connected to the two amplifiers 12 on the same source-side flexible printed circuit board 2a and the output-side spare wirings 91 are also respectively connected to the two amplifiers, it is possible to correct the disconnection, even when the disconnections respectively occur in the two different source signal lines 8 connected to the same source driver 30.

Figure 7:
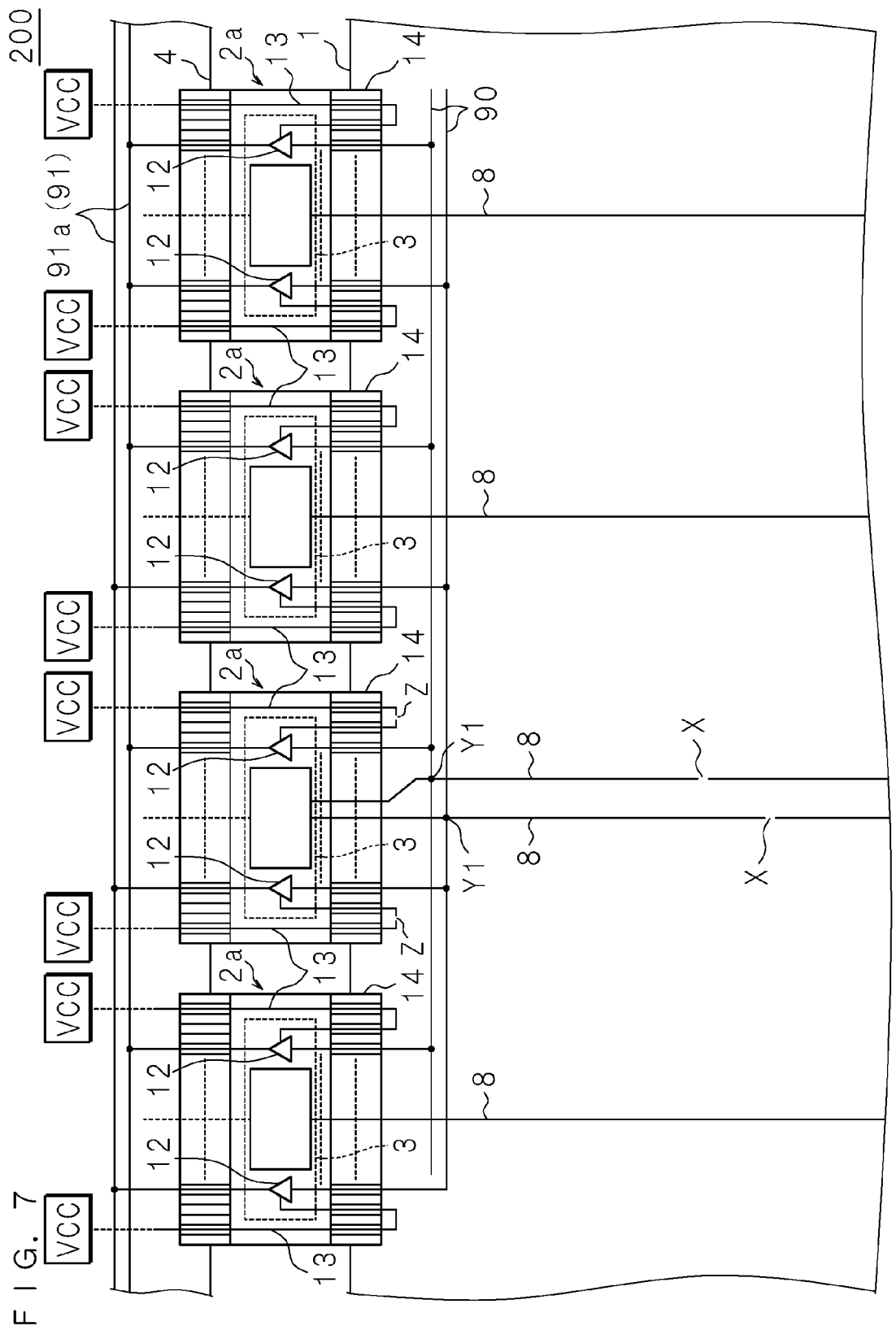
FIG. 7 is a schematic view of the periphery of the source-side flexible printed circuit board illustrating the method of correcting the wirings of the circuit device according to Embodiment 1.

FIG. 7 is a schematic view of the periphery of the source-side flexible printed circuit board 2a illustrating the method of correcting the wirings of the circuit device 200 according to Embodiment 1. Specifically, when disconnected places X respectively occur in two different source signal lines 8 connected to the same source driver 30, the two source signal lines 8 in which the disconnected places X have occurred, and input-side spare wirings 90, which are different from each other and intersect portions before the disconnected places X of the source signal lines 8 with the spare wiring insulation film interposed therebetween, are connected at short-circuited places Y1. In addition, the two source signal lines 8 and two onboard output-side spare wirings 91c, which intersect portions beyond the disconnected places X of the two source signal lines 8 and are connected to the same amplifier 12 as the input-side spare wirings 90 connected at the short-circuited places Y1, are short-circuited.

Furthermore, among the amplifiers 12 connected to the input-side spare wirings 90 which are short-circuited with the source signal lines 8 in which the disconnected places X have occurred, the folded-back parts 13a of two amplifier control wirings 13, which are connected to the control terminals 12c of the two amplifiers 12 provided on the same source-side flexible printed circuit board 2a as the corresponding source signal lines 8, are respectively cut off by the laser beam at cutting places Z in FIG. 7. By the correction method described above, even when the disconnections respectively occur in two different source signal lines 8 connected to the same source driver 30, the wirings may be corrected.

Further, in the present embodiment, it is possible to correct the wirings even when the short circuit occurs between up to three adjacent source signal lines 8. Such a short circuit occurs, for example, due to contamination with conductive dust at the time of film formation of the TFT substrate 1.

Figure 8:
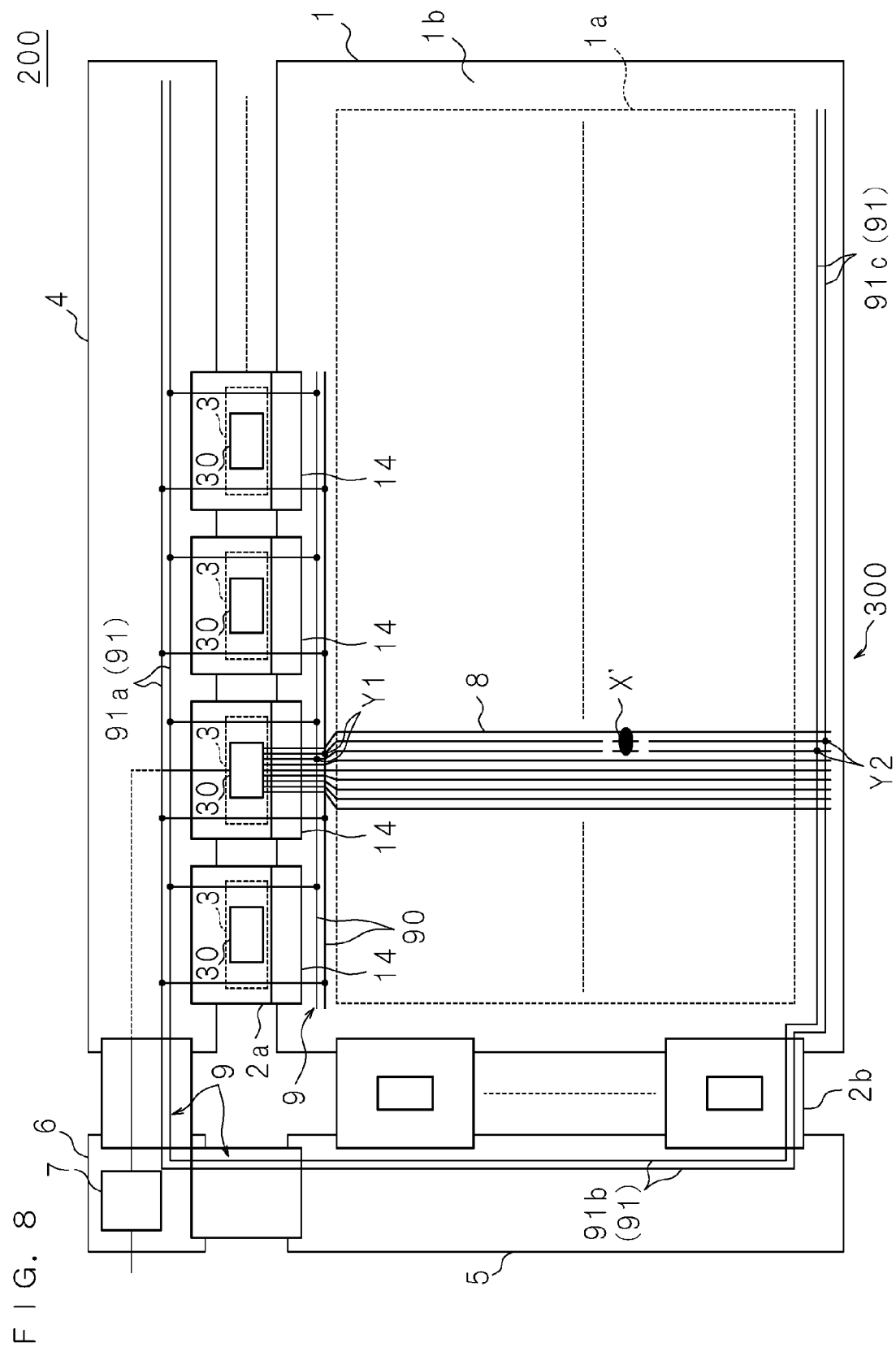
FIG. 8 is a schematic view illustrating the method of correcting the wirings of the circuit device according to Embodiment 1.

FIG. 8 is a schematic view illustrating the method of correcting the wirings of the circuit device 200 according to Embodiment 1. In the display apparatus 100 according to the present embodiment, by the similar procedure to the case in which the disconnections respectively occur in the two different source signal lines 8 drawn out from the same source-side flexible printed circuit board 2a, the short circuit between the three adjacent source signal lines 8 may be corrected.

Specifically, when there are short-circuited places X' between three adjacent source signal lines 8, a total of four places of two places before and after the short-circuited places X' of two of the three source signal lines 8 are cut off by the laser beam. By such cutting off, an electrical connection between the three source signal lines 8 is disconnected. In addition, the two cut-off source signal lines 8 and two different input-side spare wirings 90 intersecting the source signal lines 8 are short-circuited by the laser beam at the short-circuited places Y1. Furthermore, the cut-off source signal lines 8 and two onboard output-side spare wirings 91c, which intersect portions beyond the short-circuited places X' of the source signal lines 8 and are connected to the same amplifier 12 as the input-side spare wirings 90 short-circuited at the short-circuited places Y1, are connected at two short-circuited places Y2, respectively.

Then, among the amplifiers 12 connected to the two input-side spare wirings 90 which are short-circuited with the cut-off source signal lines 8, the folded-back parts 13a of two amplifier control wirings 13, which are connected to the control terminals 12c of the two amplifiers 12 provided on the same source-side flexible printed circuit board 2a as the corresponding source signal lines 8, are respectively cut off by the laser beam at the cutting places Z.

By executing the correction method described above in the wiring correction process, even when the short-circuited place X' occurs between the adjacent source signal lines 8 of the TFT substrate 1, it is possible to correct the circuit so that the source signal is correctly transmitted beyond the short-circuited place X' through the spare wiring 9.

Further, when two adjacent source signal lines 8 are short-circuited, by cutting off two places before and after the short-circuited place X' of any one source signal line 8, and then performing the same processing as the case in which the disconnection occurs in one source signal line 8, it is possible to correct the circuit.

Embodiment 2

Figure 9:
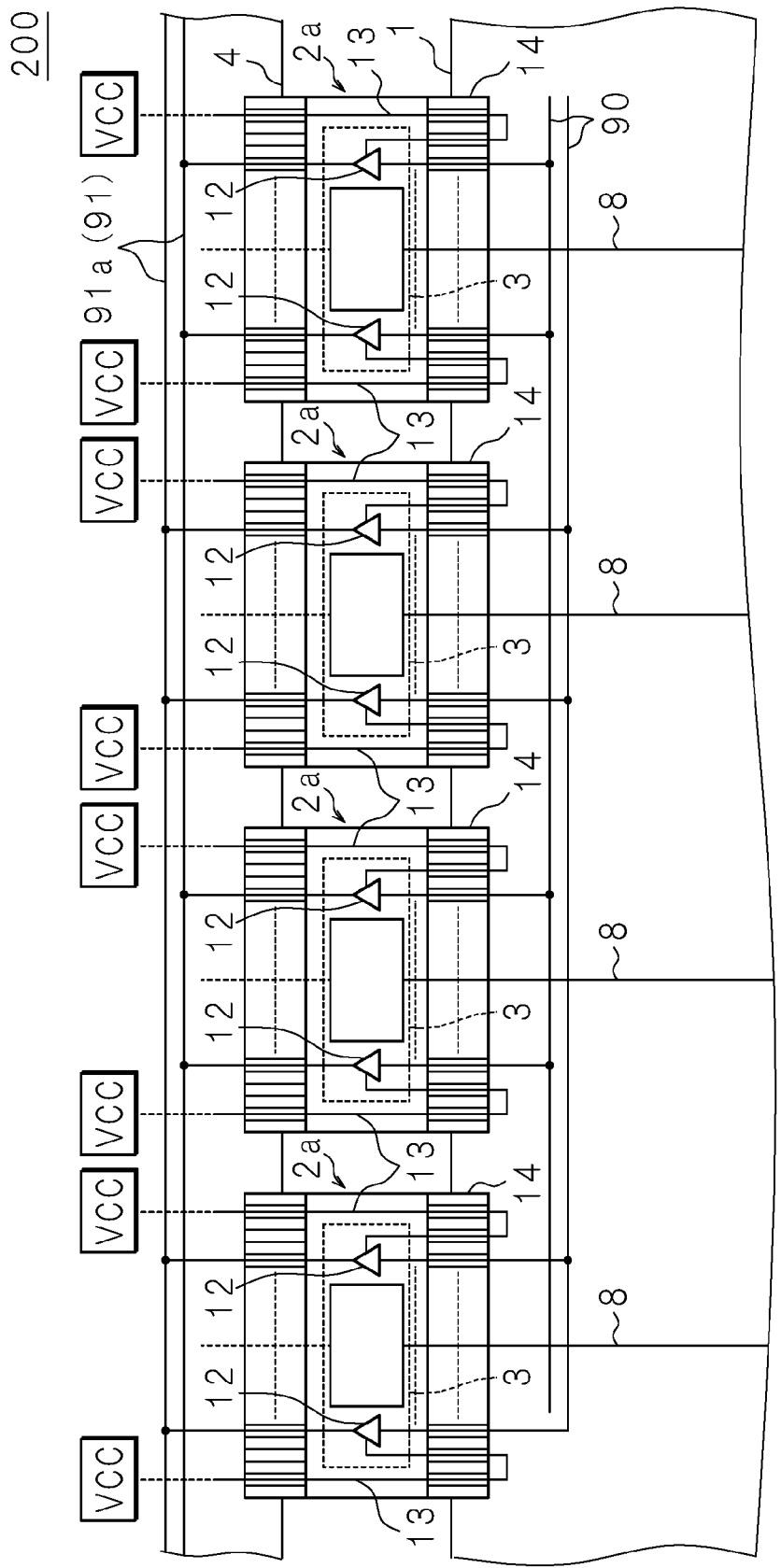
FIG. 9 is a schematic view illustrating the periphery of a source-side flexible printed circuit board of a circuit device according to Embodiment 2.

FIG. 9 is a schematic view illustrating the periphery of a source-side flexible printed circuit board 2a of a circuit device 200 according to Embodiment 2. In a display apparatus 100 according to the present embodiment, one common input-side spare wiring 90 and one common output-side spare wiring 91 are connected to two amplifiers 12 mounted on the same source-side flexible printed circuit board 2a.

Figure 10:
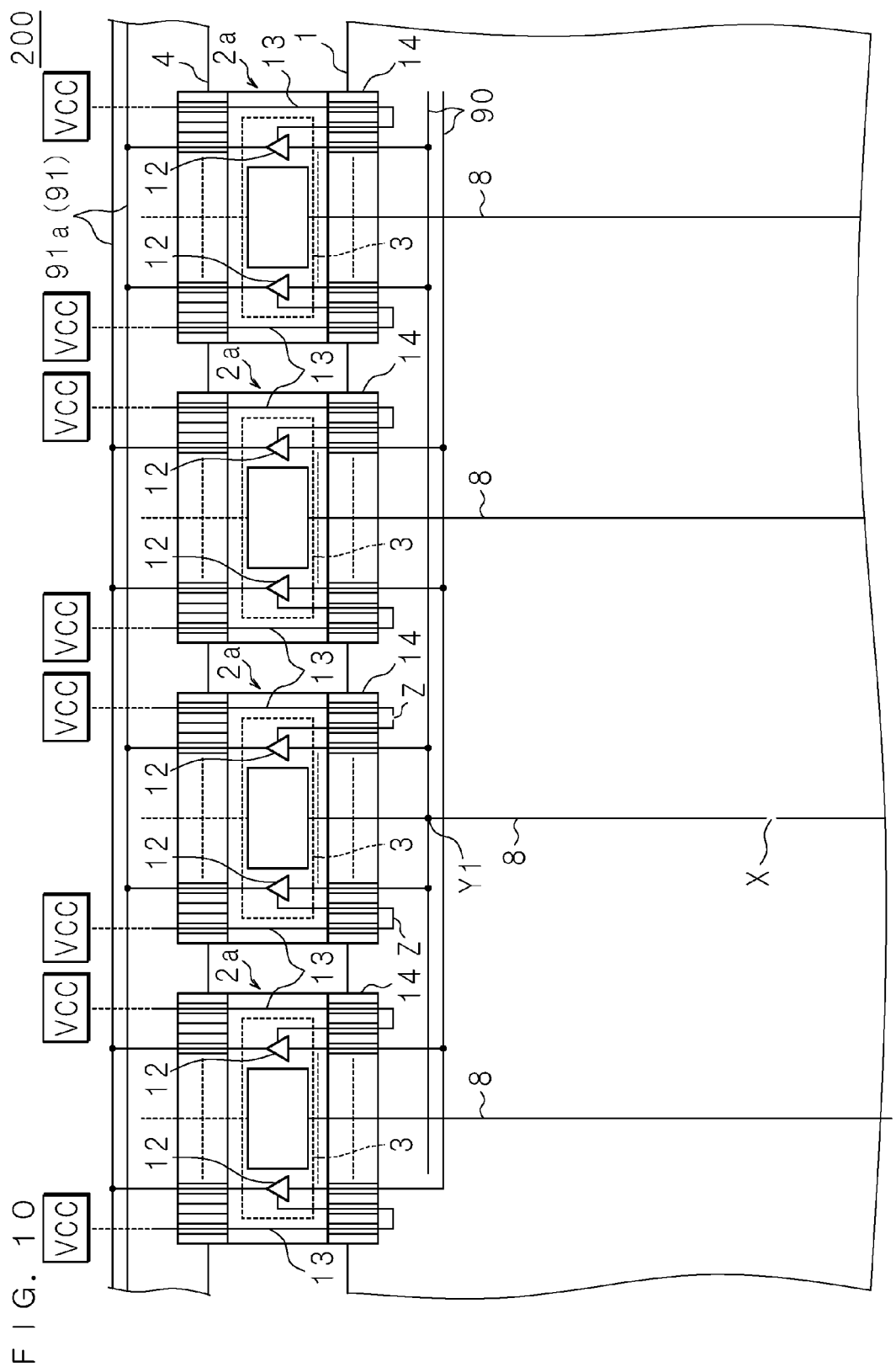
FIG. 10 is a schematic view of the periphery of the source-side flexible printed circuit board illustrating a method of correcting a wiring of the circuit device according to Embodiment 2.

FIG. 10 is a schematic view of the periphery of the source-side flexible printed circuit board 2a illustrating a method of correcting a wiring of the circuit device 200 according to Embodiment 2. In the display apparatus 100 according to the present embodiment configured as described above, the two amplifiers 12 mounted on the source-side flexible printed circuit board 2a, to which the source signal line 8 having a disconnected place X occurred therein is connected, are concurrently turned on. That is, the input-side spare wiring 90, which is connected to the two amplifiers 12 on a source driver chip 3 from which the source signal line 8 having the disconnected place X occurred therein is drawn out, is selected, and the input-side spare wiring 90 and the source signal line 8 are connected at a short-circuited place Y1. In addition, the folded-back parts 13a of the amplifier control wirings 13, which are connected to the control terminals 12c of the two amplifiers 12 on the source driver chip 3 from which the source signal line 8 is drawn out, are respectively cut off at cutting places Z in FIG. 10. Further, similar to the case of Embodiment 1, the onboard output-side spare wiring 91c connected to the turned-on amplifier 12 and the source signal line 8 in which the disconnected place X has occurred are connected at a short-circuited place Y2. By the above-described correction, the source signal is transmitted to the source signal line 8 beyond the disconnected place X.

Further, since the two amplifiers 12 on the same source-side flexible printed circuit board 2a are mounted on the same source driver chip 3, the turn on characteristics thereof are equal. Therefore, even when the amplifiers are connected to the common first relay wiring 91a, and turned on at the same time, either one is not destroyed.

In the present embodiment, since the source signal is output to the output-side spare wiring 91 through the two amplifiers 12, the source signal flowing through the output-side spare wiring 91 is more stable. Therefore, it is possible to more reliably prevent the display defect caused by the disconnected place X.

Further, the same parts in the present embodiment as those in Embodiment 1 will be denoted by the same reference numerals, and will not be described in detail.

Embodiment 3

Figure 11:
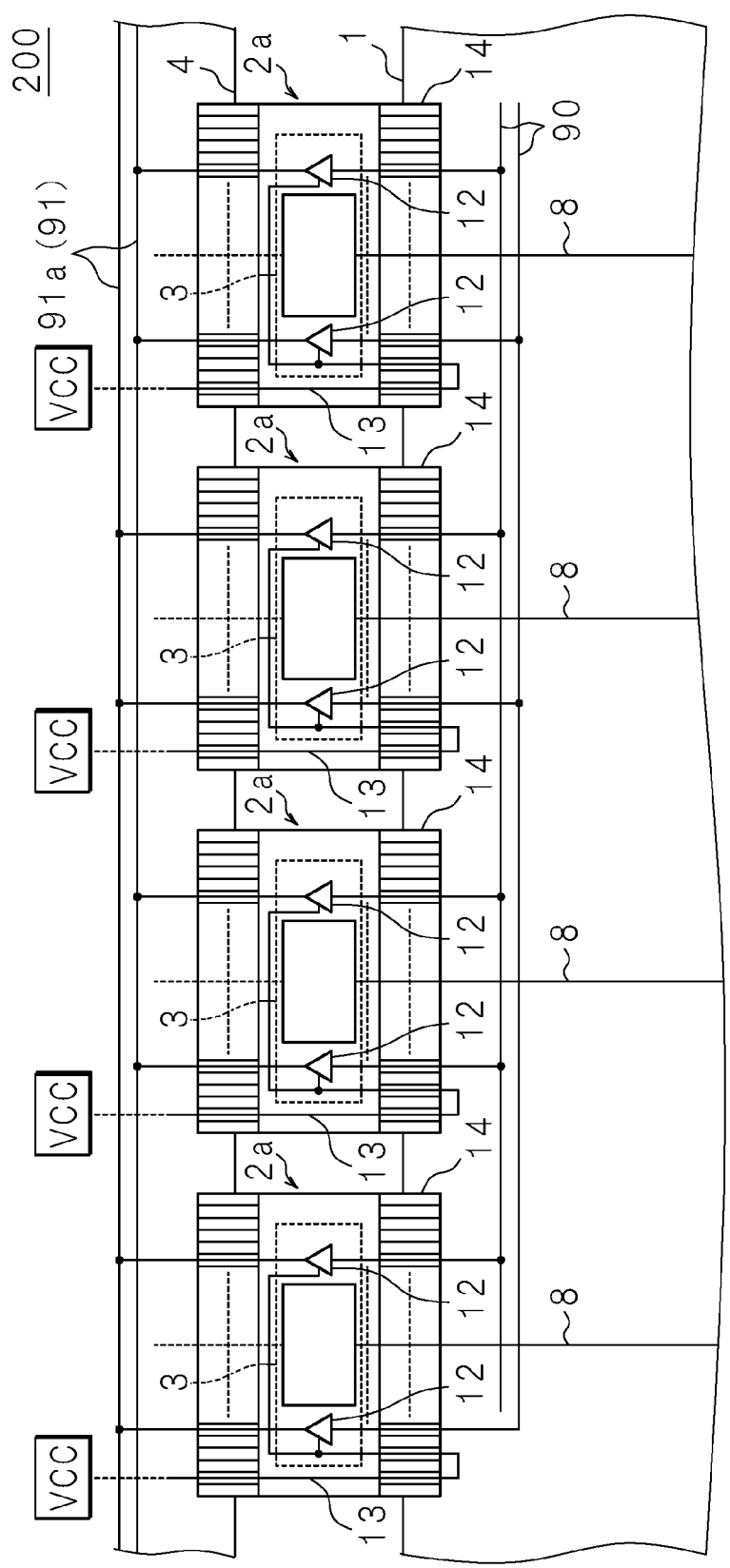
FIG. 11 is a schematic view illustrating the periphery of a source-side flexible printed circuit board of a circuit device according to Embodiment 3.

FIG. 11 is a schematic view illustrating the periphery of a source-side flexible printed circuit board 2a of a circuit device 200 according to Embodiment 3. Also in a display apparatus 100 according to the present embodiment, similar to Embodiment 2, one common input-side spare wiring 90 and one common output-side spare wiring 91 are connected to two amplifiers 12 mounted on the same source-side flexible printed circuit board 2a.

The display apparatus 100 according to Embodiment 3 is different from that of Embodiment 2 in an aspect that one common amplifier control wiring 13 is connected to each of the control terminals 12c of the two amplifiers 12 mounted on the same source-side flexible printed circuit board 2a. More specifically, the amplifier control wiring 13 passes through, for example, a left end part of a connection part output terminal 14 of the source-side flexible printed circuit board 2a from the source control board 4, then forms a folded-back part 13a by folding back at the peripheral region 1b of the TFT substrate 1, again passes through the connection part output terminal 14 at the left end part from the peripheral region 1b side, and is connected to the control terminal 12c of a left amplifier 12 on the source driver chip 3. At the same time, the amplifier control wiring 13 is also arranged inside the source driver chip 3 and also connected to the control terminal 12c of the right amplifier 12 mounted on the same source driver chip 3.

Figure 12:
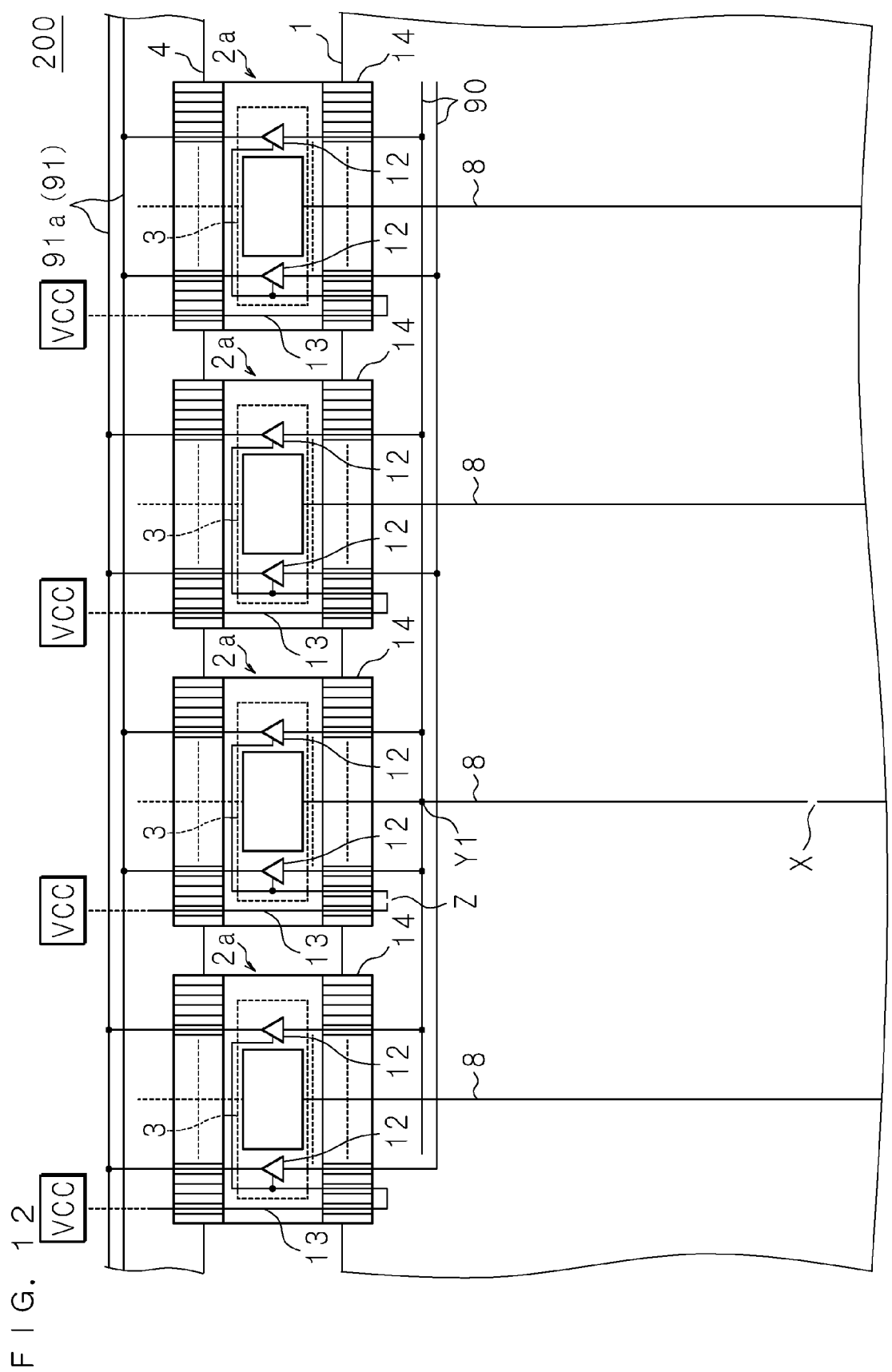
FIG. 12 is a schematic view of the periphery of the source-side flexible printed circuit board illustrating a method of correcting a wiring of the circuit device according to Embodiment 3.

FIG. 12 is a schematic view of the periphery of the source-side flexible printed circuit board 2a illustrating a method of correcting a wiring of the circuit device 200 according to Embodiment 3. In the circuit device 200 according to the present embodiment, since the two amplifiers 12 on the same source-side flexible printed circuit board 2a are connected to one common amplifier control wiring 13, by cutting off the folded-back part 13a of one place at Z in FIG. 12, the two amplifiers 12 may be simultaneously turned on. Therefore, the method for correcting the wiring of the display apparatus 100 according to the present embodiment is easier than that in Embodiment 2 due to the reduced man-hours.

Further, the same parts in the present embodiment as those in the above-described other embodiments will be denoted by the same reference numerals, and will not be described in detail.

In each of the above-described embodiments, for simplification of explanation, only the configuration for correcting the defect of the source signal line has been described. However, in order to correct the defect of the gate signal line, it is also possible to provide the similar amplifier and spare wiring. In such a case, the input-side spare wiring for the gate signal line is arranged in the peripheral region of the TFT substrate so as to be laid along a short side of the TFT substrate on a side to which the gate-side flexible printed circuit board is connected. In addition, the onboard output-side spare wiring for the gate signal line is arranged in the peripheral region so as to be laid along a short side of the TFT substrate on a side opposite to the side to which the gate-side flexible printed circuit board is connected. The first relay wiring and the second relay wiring for the gate signal line are arranged on the gate-side flexible printed circuit board and the source-side flexible printed circuit board.

Further, in each of the above-described embodiments, the display apparatus may not include the television tuner.

In addition, in each of the above-described embodiments, the display apparatus is not limited to the active matrix type liquid crystal display apparatus. For example, the display apparatus may be an active matrix type organic electroluminescence (EL) display apparatus. Alternatively, the display apparatus may be a passive matrix type liquid crystal display apparatus or an organic EL display apparatus.

Furthermore, it is not limited to the configuration in which the amplifier is turned off while the voltage Vcc is input to the control terminal, and is turned on when the voltage is not input. For example, it may be configured in such a way that the amplifier is turned off when the voltage is not input to the control terminal, and is turned on while the Vcc is input. In this case, for example, by connecting with an amplifier control wiring arranged in a divided manner, the amplifier may be selectively turned on.

In addition, the application of the circuit device of the disclosed embodiment is not limited to only the TFT substrate of the display apparatus. The circuit device of the disclosed embodiment may be applied to any circuit board as long as it is a circuit board on which a large number of signal lines are arranged.

It is to be noted that, as used herein and in the appended claims, the singular forms "a", "an", and "the" include plural referents unless the context clearly dictates otherwise.

It should be understood that the embodiments disclosed herein are illustrative and non-restrictive in every respect. Since the scope of the disclosed embodiment is defined by the appended claims rather than by the description preceding them, and all changes that fall within metes and bounds of the claims, or equivalence of such metes and bounds thereof are therefore intended to be embraced by the claims.

The invention claimed is:

1. A circuit device comprising:
   a first circuit board on which a plurality of signal lines transmitting a signal, and spare wirings intersecting the signal lines while being insulated therefrom and transmitting the signal if at least one of the signal lines has a defect are arranged; and
   a plurality of second circuit boards connected to the first circuit board,
   wherein each of the second circuit boards has a drive circuit inputting the signal to any one or more of the plurality of signal lines, and a plurality of amplifiers each of which has an input terminal to which the signal is input, an output terminal amplifying the signal input to the input terminal and outputting an amplified signal, and a control terminal to which a control signal for controlling a turn on or off of an amplification operation is input, and a control wiring connected to the control terminal,
   the spare wirings include a plurality of input-side spare wirings, and a plurality of output-side spare wirings
   in each of the second circuit boards, the input terminal of each of the plurality of amplifiers is connected to any one of the plurality of input-side spare wirings, and the output terminal of each of the plurality of amplifiers is connected to any one of the plurality of output-side spare wirings, and
   in at least one second circuit board of the plurality of second circuit boards, the control wiring includes a first part connected to the control terminal and arranged on the one second circuit board, a second part away from the first part and arranged on the one second circuit board, and a third part connected to the first part and the second Part and arranged on the first circuit board.

2. The circuit device according to claim 1, wherein the plurality of input-side spare wirings include a first input-side spare wiring and a second input-side spare wiring,
   the plurality of output-side spare wirings include a first output-side spare wiring and a second output-side spare wiring, and
   in each of the second circuit boards, the plurality of amplifiers include, a first amplifier with the input terminal connected to the first input-side spare wiring and the output terminal connected to the first output-side spare wiring, and a second amplifier with the input terminal connected to the second input-side spare wiring and the output terminal connected to the second output-side spare wiring.

3. The circuit device according to claim 1, wherein the plurality of input-side spare wirings include a first input-side spare wiring and a second input-side spare wiring,
   the plurality of output-side spare wirings include a first output-side spare wiring and a second output-side spare wiring,
   in each of a plurality of third circuit boards arranged at every predetermined number of the plurality of second circuit boards, each of the plurality of amplifiers has the input terminal connected to the first input-side spare wiring and the output terminal connected to the first output-side spare wiring, and
   in each of a plurality of forth circuit boards arranged next to at least one side of any one of the third circuit boards among the plurality of second circuit boards, each of the plurality of amplifiers has the input terminal connected to the second input-side spare wiring and the output terminal connected to the second output-side spare wiring.

4. A display apparatus comprising the circuit device according to claim 1, wherein the signal lines transmit an image signal.

5. The circuit device according to claim 3, wherein, in the one second circuit board, each of a plurality of control wirings connected to the control terminal of each of the plurality of amplifiers have a common part, and
   the common part includes the third part.

* * * * *